United States Patent [19]

Masaki et al.

[11] Patent Number: 5,206,093
[45] Date of Patent: Apr. 27, 1993

[54] MULTILAYER METAL-COATED STEEL SHEET

[75] Inventors: Katsuhiko Masaki, Sakai; Suenori Mori, Amagasaki; Tsuguyasu Yoshii, Matsudo, all of Japan

[73] Assignee: Nisshin Steel Co., Ltd., Tokyo, Japan

[21] Appl. No.: 773,497

[22] Filed: Oct. 9, 1991

[30] Foreign Application Priority Data

Oct. 17, 1990 [JP] Japan ................................. 2-278306
Nov. 30, 1990 [JP] Japan ................................. 2-334423

[51] Int. Cl.$^5$ .............................................. B32B 15/18
[52] U.S. Cl. ..................................... 428/651; 428/660
[58] Field of Search ............... 428/660, 651, 684, 653, 428/654; 420/552

[56] References Cited

U.S. PATENT DOCUMENTS

| | | | |
|---|---|---|---|
| 2,686,354 | 8/1954 | Lundin | 428/651 |
| 2,800,707 | 7/1957 | Whitfield et al. | 428/651 |
| 2,908,966 | 10/1959 | Wagner | 428/660 |
| 3,473,216 | 10/1969 | Webb | 428/660 |
| 3,616,301 | 10/1971 | Miyata | 428/651 |
| 3,653,852 | 4/1972 | Seiler | 428/651 |
| 3,689,232 | 9/1972 | Baba | 428/651 |
| 3,798,011 | 3/1974 | Sharp | 428/651 |
| 4,906,533 | 3/1990 | Kagechika et al. | 428/651 |
| 4,963,440 | 10/1990 | Shimoyori et al. | 428/651 |

FOREIGN PATENT DOCUMENTS 58-11770  1/1983  Japan ................................. 428/651

Primary Examiner—John Zimmerman
Attorney, Agent, or Firm—Foley & Lardner

[57] ABSTRACT

A multilayer metal-coated steel sheet comprising as a first layer a Zr coating layer formed on the surface of a steel sheet, and as a second layer an Al coating layer formed on said first layer. As another embodiment, also disclosed is a multilayer metal-coated steel sheet comprising as a first layer a Zr coating layer formed on the surface of a steel sheet, as a second layer an Al-Zr alloy coating layer containing Zr in an amount of 1% by weight to 50% by weight, formed on said first layer, and as a third layer an Al coating layer formed on said second layer.

The multilayer metal-coated steel sheet of the present invention has an improved corrosion resistance, heat resistance and formability.

14 Claims, No Drawings

MULTILAYER METAL-COATED STEEL SHEET

BACKGROUND OF THE INVENTION

This invention relates to a multilayer metal-coated steel sheet having a good corrosion resistance, heat resistance and formability. More particularly, it relates to a multilayer metal-coated steel sheet provided on its surface with a Zr coating layer on which only an Al coating layer is formed or an Al-Zr alloy coating layer containing 1 to 50% by weight of Zr and an Al coating layer are formed.

Al-coated steel sheets have been hitherto used in a large quantity. Those which are in common use among them are hot dip Al-coated steel sheets comprising a single coating layer formed by directly coating Al on a steel sheet by hot dipping.

Such hot dip Al-coated steel sheets can achieve a good corrosion resistance and heat resistance so long as they have a coating layer with a thickness of 8 $\mu$m or more, and hence have been in wide use for exhaust gas system members of automobiles, combustion machinery system members, household equipment members, etc. In some uses, however, there is recently a demand for thin-coating steel sheets for the purpose of reducing cost for the manufacture of members, or studies are made on whether their uses can be expanded to a use in which steel sheets may be affected by corrosion due to salt damage from sea water.

Where, however, the hot dip Al-coated steel sheets are used in an environment that may cause the corrosion due to salt damage, e.g., an environment in which halogen ions are present, an oxide film formed on the surface, having a corrosion resistance, is solved to produce thereon white rust mainly composed of Al(OH)$_3$, or to cause pit corrosion reaching the substrate steel.

Now, when they may be affected by salt damage in their use, the coating layer is made to have a thickness of as large as 40 $\mu$m so that the corrosion does not reach the substrate steel in a short time. There, however, has been the problem that making the coating layer have such a large thickness results in a lowering of formability and also a high cost. The coating surface may also be subjected to chemical conversion such as chromate treatment that is a post treatment commonly applied on coated steel sheets. This treatment, however, can only bring about a temporary effect, and can not fundamentally improve the corrosion resistance.

In the hot dip Al-coated steel sheets, Si is incorporated in the coating layer usually in an amount of 8 to 12% so that an Al-Fe alloy layer formed at the interface between the substrate steel and the coating layer and having a poor formability can be prevented from being developed. In such an instance, if the substrate steel is a low-carbon rimmed steel or Al killed steel usually used, the interface between the coating layer and the substrate steel may be preferentially oxidized when heated to 600° C. or above, and the coating layer may be made into an alloy when heated at 700° C. or above to cause peeling. Thus the incorporation of Si is not necessarily satisfactory in view of corrosion resistance. This problem on corrosion resistance can be settled by use of a substrate steel comprising a low carbon, Ti-added steel or very low carbon, 0.2Ti-added steel that is durable to repeated heating at 650° C. or above. Use of such a Ti-added steel may undesirably result in a relatively high manufacture cost, compared with the Al killed steel or the like. Even with use of the substrate steel comprising the Ti-added steel, a brittle Al-Fe-Si alloy layer is produced at the interface between the substrate steel and the coating layer, and hence no satisfactory formability can be obtained.

On the other hand, an Al-coated steel sheet in which no Al-Fe alloy coating layer may be produced at the interface between the substrate steel and the coating layer can be manufactured if coating is carried out by Al electrodeposition or Al vacuum deposition. However, Al-coated steel sheets manufactured by such processes have a poor heat resistance because the heating at a high temperature causes diffusion of Al of the coating layer into the substrate steel to result in oxidation of the substrate steel. Pinholes reaching the substrate steel are also present in the coating layer, and hence there is a problem on the corrosion resistance in a severe corrosive environment

SUMMARY OF THE INVENTION

A first object of the present invention is to provide an Al type multilayer metal-coated steel sheet having a superior corrosion resistance such that the pit corrosion does not reach the substrate steel in a short time even if the coating layer is not formed in a large thickness.

A second object of the present invention is to provide an Al type multilayer metal-coated steel sheet whose coating layer is not made into an alloy at a temperature of 700° C. or above even when the substrate steel comprises a low-carbon rimmed steel or Al killed steel.

Another object of the present invention is to provide an Al type multilayer metal-coated steel sheet whose coating layer has at least the same adhesion as in conventional hot dip Al-coated steel sheets.

In the present invention, a high-melting Zr coating layer is formed on the surface of a steel sheet so that no coating layer may be alloyed with the substrate, and also on the Zr coating layer an Al coating layer having a good corrosion resistance and formability or an Al-Zr alloy coating layer and an Al coating layer is/are formed. Thus the above objects can be achieved.

Stated summarily, the present invention provides a multilayer metal-coated steel sheet comprising as a first layer a Zr coating layer formed on the surface of a steel sheet, and as a second layer an Al coating layer formed on said first layer. In another embodiment, it also provides a multilayer metal-coated steel sheet comprising as a first layer a Zr coating layer formed on the surface of a steel sheet, as a second layer an Al-Zr alloy coating layer containing Zr in an amount of 1% by weight to 50% by weight, formed on said first layer, and as a third layer an Al coating layer formed on said second layer.

DESCRIPTION OF THE PREFERRED EMBODIMENTS

An essential condition for improving the corrosion resistance, heat resistance and formability of Al-coated steel sheets is to cause no galvanic currents to occur at the interface between the coating layer and the substrate steel, and also to cause no formation of an Al-fe alloy coating layer at the interface of the both.

More specifically, the corrosion of Al-coated steel sheets is pit corrosion. This pit corrosion is produced when a local electric cell is formed between the substrate steel and the coating layer via a pinhole, which produces a galvanic current flowing between them, and thus the coating layer comes to have a base potential and is preferentially solved. This galvanic current is considerably so great that local solution rapidly takes place in the coating layer, until the solution extends to the surroundings. At the time the solution of the coating layer has extended beyond the scope to which the sacrificial corrosion prevention of Al to the substrate steel does not act, the corrosion of the substrate steel begins, so that red rust is produced there. Accordingly, in order to improve the corrosion resistance, it is necessary to take a means of causing no galvanic current between the coating layer and the substrate steel.

The Al-Fe alloy coating layer is brittle, and grows upon heating. Hence, in order to improve the heat resistance and formability, it is necessary to take a means of not bring this alloy layer into existence.

As in the present invention, when a first layer Zr coating layer is formed on the surface of a steel sheet and a second layer Al coating layer is formed on the second layer to give a two-layer metal-coated steel sheet, or when a first layer Zr coating layer is formed on the surface of a substrate and a second layer Al-Zr alloy coating layer and a third layer Al coating layer are successively formed on the first layer to give a three-layer metal-coated steel sheet, the corrosion resistance, heat resistance and formability can be improved in the following manner:

(1) Since in both the above metal-coated steel sheets the uppermost layer Al coating layer has a baser potential than lower-side Zr coating layer or Al-Zr alloy coating layer, pit corrosion may take place when a pinhole is present in the Al coating layer. Since, however, the lower-side Zr coating layer or Al-Zr alloy coating layer is not easily corroded, the pit corrosion does not proceed wit ease, so that it takes a long time until the corrosion reaches the substrate steel.

(2) In the case of the two-layer metal-coated steel sheet, there is a great potential difference between the second layer Al coating layer and the first layer Zr coating layer. When, however, the first layer is covered with a corrosion product as exemplified by Al(OH)$_3$ of the second layer, the second layer and the first layer come to have an approximate potential, and hence the galvanic current occurring between the both becomes small, so that the expansion of corrosion to the surroundings becomes smaller than the case of Al single layer coating. In the case of the three-layer metal-coated steel sheet, the third layer Al coating layer and the second layer Al-Zr alloy coating layer have potential approximate to each other. Hence, even if the second layer is not covered with the corrosion product of the third layer, the galvanic current occurring between the both layers is small and the expansion of corrosion to the surroundings is smaller than the case of Al single layer coating.

(3) In both the metal-coated steel sheets, the uppermost layer Al coating layer has a sacrificial corrosion preventive action against the substrate steel even if corrosion proceeds to the first layer Zr coating layer and pinholes are present at the part the corrosion has proceeded. Hence, the substrate steel is not corroded although it has baser potential than the Zr coating layer. Moreover, the substrate steel has a very small uncovered area, and hence the galvanic current of the local electric cell formed between it and the uppermost Al coating layer is very small, so that the uppermost layer may only be corroded at a very small rate.

(4) Even if the corrosion due to pit corrosion has extended beyond the scope to which the sacrificial corrosion preventive action of the uppermost layer Al coating layer to the first layer Zr coating layer, the pinholes in the first layer Zr coating layer are enclosed by the corrosion product as exemplified by Al(OH)$_3$ of the second layer in the case of the two-layer metal-coated steel sheet, and by the corrosion products of the second and third layers in the case of the three-layer metal-coated steel sheet, so that the substrate steel can be prevented from its corrosion.

(5) In both the metal-coated steel sheets, the first layer Zr coating layer does not react with the substrate steel to form no alloy layer even when heated to about 700° C. On the other hand, if the Al coating layer or the Al-Zr alloy coating layer is in contact with the substrate steel, there is no such a barrier effect attributable to Zr, and hence Al diffuses into the substrate steel upon heating to about 700° C., bringing the Al-Fe alloy coating layer into existence.

In the case of the two-layer metal-coated steel sheet, the steel sheet has a small action in regard to the above (1), (2) and (4), and therefore has a lower corrosion resistance than the three-layer metal-coated steel sheet.

In the case of the two-layer metal-coated steel sheet, the first layer Zr coating layer can bring about the effect of improving the corrosion resistance and heat resistance, if it has a layer thickness of 0.05 $\mu$m or more. An excessively large thickness, however, may cause a lowering of formability. The second layer Al coating layer can promise a good formability without regard to the layer thickness. A layer thickness less than 0.5 $\mu$m, however, may result in an insufficient corrosion resistance and heat resistance.

The total layer thickness of the first and second layers may preferably be controlled to be not less than 0.55 $\mu$m and less than 20 $\mu$m, and if possible, to be not less than 3 $\mu$m and less than 10 $\mu$m. A total thickness less than 0.55 $\mu$m may result in an insufficient corrosion resistance and heat resistance. A total thickness not less than 20 $\mu$m may result in a rise of steel sheet temperature because of condensation heat of deposition vapor when the coating is carried out by vacuum deposition, to bring about a possibility of damaging the mechanical properties of the steel sheet, or may result in an increase in manufacture cost when the coating is carried out by other process such as electroplating.

If the first layer is formed in a larger thickness, the formability may be lowered to cause a deterioration of corrosion resistance after the forming. Hence the first layer should be made to have a layer thickness not more than 60%, and preferably not more than 30%, of the total layer thickness.

In the case of the three-layer metal-coated steel sheet also, the first layer Zr coating layer can bring about the effect of improving the corrosion resistance and heat resistance when it has a layer thickness of 0.05 $\mu$m or more. An excessively large thickness may cause a lowering of formability. The second layer Al-Zr alloy coating layer can also bring about the effect of improving the corrosion resistance and heat resistance, when it has a Zr content of 1% by weight to 50% by weight and a layer thickness of not less than 0.05 $\mu$m. A Zr content or layer thickness less than these values can not bring about any satisfactory effect of improvement. This second Al-Zr alloy coating layer having an excessively large thickness may cause a lowering of formability, and hence may bring about a possibility of cracking at the time of forming. X-ray diffraction of the Al-Zr alloy coating layer formed by vacuum deposition or thermal diffusion reveals that the layer is mainly composed of Al$_3$Zr that may give not so good formability. From this fact, this second layer is presumed to be not so contributory to good formability.

The third layer Al coating layer should be made to have a thickness of not less than 0.5 μm for the same reason as the case of the two-layer metal-coated steel sheet.

The total layer thickness of the first to third layers may preferably be controlled to be not less than 0.6 μm and less than 20 μm, and if possible, to be not less than 3 μm and less than 10 μm. A total thickness less than 0.6 μm may result in an insufficient corrosion resistance and heat resistance. A total thickness not less than 20 μm may result in a rise of steel sheet temperature because of condensation heat of deposition vapor when the coating is carried out by vacuum deposition, to bring about a possibility of damaging the mechanical properties of the steel sheet and also bring about an increase in manufacture cost. If the first and second layers are formed in a larger thickness, the formability may be lowered to cause a deterioration of corrosion resistance after the forming. Hence the first and second layers should be made to have a total layer thickness not more than 60%, and preferably not more than 30%, of the total layer thickness of all the layers.

The multilayer metal-coated steel sheet of the present invention can be manufactured by vacuum deposition, electroplating, spraying, or any combination of these coating processes. It is advantageous to use vacuum deposition. In particular, in the case of the three-layer metal-coated steel sheet, the following methods can manufacture the desired metal-coated steel sheet with ease.

A first method is a method making use of binary simultaneous vacuum deposition. More specifically, a Zr evaporation source is set on the steel sheet inlet side in a vacuum chamber, and an Al evaporation source, on the outlet side, which are so disposed that when Zr and Ar are each evaporated from the evaporation source, part of Zr vapor and part of Al vapor may overlap at the middle position between the both evaporation sources in the course through which the steel sheet advances. Disposing the evaporation sources in this way makes Zr vapor, Al-Zr mixed vapor and Al vapor present in order from the steel sheet inlet side, so that Zr, Al-Zr alloy and Al can be successively deposited as the steel sheet is passed through the course. The total layer thickness of all the coating layers and the layer thickness proportion of the layers may be adjusted by controlling the size and proportion of the electric power applied to each evaporation source, the space between the Zr evaporation source and the Al evaporation source, the distance between the evaporation sources and the steel sheet, the degree of vacuum and the deposition time.

A second method is a method comprising the steps of forming the first layer Zr coating layer by vacuum deposition, thereafter depositing Al, and then thermally diffusing Al into the surface layer of the Zr coating layer by utilizing the steel sheet temperature and the condensation heat of Al vapor, to make Al and Zr into an Al-Zr alloy. This method enables formation of the Al-Zr alloy coating layer and the Al coating layer by the deposition of Al. The deposition of each metal in these first and second methods may be carried out by electron-beam deposition, arc discharging, or sputtering.

EXAMPLES

Example 1

According to the following coating methods, Zr and Al coating layers were successively formed to manufacture two-layer metal-coated steel sheets.

(1) Coating method 1

An Al killed cold rolled steel sheet (sheet thickness: 0.6 mm; C: 0.017%) degreased by alkali electrolysis was set in a vacuum deposition apparatus comprised of a water cooling copper hearth in which Zr was put and a ceramic crucible in which Al was put. The inside of the apparatus was evacuated to a degree of vacuum of $1 \times 10^{-4}$ to $1 \times 10^{-5}$ Torr, and then beamlike Ar ions were emitted from an ion beam generator called as an ion source, at an accelerating voltage of 5 kV to make them collide against the steel sheet, thereby removing impurities such as oxides from the steel sheet surface and activating the surface.

Next, at the same degree of vacuum, the Zr in the vacuum deposition apparatus was melted and evaporated with electron beams and thus the Zr was deposited on the steel sheet. Thereafter, the Al was similarly melted and evaporated and thus the Al was deposited on the Zr layer.

(2) Coating method 2

In the coating method 1, the Al deposition carried out after the Zr deposition was stopped to prepare a Zr-coated steel sheet. This Zr-coated steel sheet was put into a molten salt Al plating bath comprised of 33 mol % of ethylmethylimidazolium chloride and 67 mol % of aluminum chloride, and Al coating was carried out under plating conditions of a bath temperature of 60° C., a current density of 10 A/dm$^2$ and a bath flow velocity of 0.6 m/sec.

The following tests were carried out on the two-layer metal-coated steel sheets manufactured by the above two ways of coating methods, an Al or Zr single-layer vacuum deposition coated steel sheet, and a hot dip Al coated steel sheet (9% Si added).

(1) Adhesion test

Putting a test sample with its coating layer side outwards, the sample was bent by 180° in adhesion. A cellophane adhesive tape was stuck to the bent portion and then peeled off to examine whether or not the coating layer was separated, the results of which were evaluated according to the following criterions.

A: No separation of the coating layer.
C: Coating layer separated.

(2) Corrosion resistance test before forming

The salt spray test as prescribed in JIS Z 2371 was carried out to measure the time by which red rust occurred, the results of which were evaluated according to the following criterions. As test pieces, those with a size of 70×150 mm was used, and their edges and back surfaces were sealed.

A: No red rust occurred in 400 hours.
B: Red rust occurred in 200 to 400 hours.
C: Red rust occurred in 200 hours.

(3) Corrosion resistance test after forming

Putting a test sample with its coating layer side outwards, cylindrical draw forming was carried out in a diameter of 41.5 mm and a depth of 25 mm. The same salt spray test as in the corrosion resistance test before forming was carried out and the state of the occurrence of red rust was evaluated according to the same criterions.

(4) Heat resistance test

A heating-cooling cycle test in which a test sample was heated at 800° C. for 8 hours in the atmosphere and then air-cooled for 16 hours was set up as one cycle, and this cycle test was carried out three times. Thereafter, oxidation gain was measured from the difference in weight before and after the cycle test, the results of which were evaluated according to the following criterions.

A: Oxidation gain, 50 g/m² or less.
B: Oxidation gain, 50 g/m² or more and 100 g/m² or less.
C: Oxidation gain, 100 g/m² or more.

These test results are shown in Table 1 together. In Comparative Examples 1, 2 and 3 shown in Table 1, the steel sheets were each the same cold rolled steel sheet as the Al killed steel sheet used in the coating method 1. The Zr layer or Al layer in Comparative Examples 1 and 2 was deposited by the coating method 1.

of vacuum of $1 \times 10^{-4}$ to $1 \times 10^{-5}$ Torr, and then beam-like Ar ions were emitted from an ion beam generator, at an accelerating voltage of 5 kV to make them collide against the steel sheet, thereby removing impurities such as oxides from the steel sheet surface and activating the surface. Next, while the steel sheet was moved at the same degree of vacuum, the Zr, Al-Zr alloy and Al were melted and evaporated with electron beams and thus the Zr, Al-Zr alloy and Al were successively deposited.

(2) Coating method 4

An Al killed cold rolled steel sheet (sheet thickness: 0.6 mm; C: 0.017%) degreased by alkali electrolysis was passed through a vacuum chamber of a vacuum deposition apparatus comprised of a water cooling copper hearth in which Zr was put and a ceramic crucible in which Al was put, which were disposed in the vacuum chamber and so designed that Zr deposition and Al deposition were exchangeable each other, and the surface of the steel sheet was activated in the same manner as in the coating method 3, and at the same time heated to a temperature of 400° C. to deposit Zr by electron beam deposition. Next, Al was deposited by electron beam deposition, and then the steel sheet temperature

TABLE 1

| Sample No.: | Coating method | Coating layer thickness | | | | Coating layer performance | | | |
| --- | --- | --- | --- | --- | --- | --- | --- | --- | --- |
| | | Zr layer (μm) | Al layer (μm) | Total layer thickness (μm) | Zr/total layer thickness ratio (%) | Adhesion | Corrosion resistance | | Heat resistance |
| | | | | | | | Before forming | After forming | |
| Example | | | | | | | | | |
| 1 | Method 1 | 0.06 | 6.0 | 6.06 | 1.0 | A | A | A | A |
| 2 | Method 1 | 0.3 | 0.6 | 0.9 | 33 | A | B | B | A |
| 3 | Method 1 | 1.0 | 5.0 | 6.0 | 17 | A | A | A | A |
| 4 | Method 2 | 1.0 | 5.0 | 6.0 | 17 | A | A | A | A |
| 5 | Method 2 | 4.0 | 6.2 | 10.2 | 39 | A | A | A | A |
| 6 | Method 1 | 5.3 | 4.3 | 9.6 | 55 | A | A | A | A |
| 7 | Method 1 | 7.4 | 10.3 | 17.7 | 42 | A | A | A | A |
| 8 | Method 1 | 0.03 | 6.0 | 6.03 | 0.5 | A | B | B | B |
| 9 | Method 1 | 4.0 | 2.2 | 6.2 | 65 | A | A | C | A |
| Comparative Example | | | | | | | | | |
| 1 | VD* | 0 | 6.0 | 6.0 | — | A | C | C | C |
| 2 | VD* | 3.0 | 0 | 3.0 | — | A | C | C | C |
| 3 | Hot dip Al coated steel sheet | | 7.4 | — | | A | C | C | C |

*Vacuum deposition coating

Example 2

According to the following vacuum deposition processes, Zr, Al-Zr alloy and Al coating layers were successively formed to manufacture three-layer metal-coated steel sheets.

(1) Coating method 3

An Al killed cold rolled steel sheet (sheet thickness: 0.6 mm; C: 0.017%) degreased by alkali electrolysis was passed through a vacuum chamber of a binary vacuum deposition apparatus comprised of a water cooling copper hearth in which Zr was put and a ceramic crucible in which Al was put, which were placed on the inlet side and the outlet side, respectively, of the vacuum chamber, and the space between the water cooling copper hearth and the crucible were so adjusted that part of Zr vapor and part of Al vapor were mixed at the middle position between the both evaporation sources in the course through which the steel sheet was passed. The inside of the apparatus was evacuated to a degree was raised to 600° C. utilizing the condensation heat of Al deposition vapor to make the surface layer of the Zr coating layer into an Al-Zr alloy.

The following tests were carried out on the three-layer metal-coated steel sheets manufactured by the above coating methods, an Al or Zr single-layer vacuum deposition coated steel sheet, a Zr/Al (lower layer/upper layer) multilayer vacuum deposition coated steel sheet, and a hot dip Al coated steel sheet (containing 9% Si).

(1) Adhesion test

The test was carried out in the same manner as in Example 1.

(2) Corrosion resistance test before forming

The salt spray test was carried out in the same manner as in Example 1 to measure the time by which red rust occurred, the results of which were evaluated according to the following criterions.
A: No red rust occurred in 500 hours.
B: Red rust occurred in 200 to 500 hours.
C: Red rust occurred in less than 200 hours.

(3) Corrosion resistance test after forming

The test was carried out in the same manner as in Example 1.

(4) Heat resistance test

The test was carried out in the same manner as in Example 1.

These test results are shown in Table 2 together. In Comparative Examples 1 to 5 shown in Table 2, the steel sheets were each the same cold rolled steel sheet as the Al killed steel sheet used in the coating method 3. The Zr layer or Al layer in Comparative Examples 1 to 4 was deposited by the coating method 1.

5. A multilayer metal-coated steel sheet according to claim 1, wherein said Zr coating layer has a layer thickness of not more than 60% of the total layer thickness.

6. A multilayer metal-coated steel sheet according to claim 5, wherein said Zr coating layer has a layer thickness of not more than 30% of the total layer thickness.

7. A multilayer metal-coated steel sheet comprising as a first layer a coating layer consisting essentially of Zr formed on the surface of a steel sheet, as a second layer an Al-Zr alloy coating layer containing Zr in an amount of 1% by weight to 50% by weight, formed on said first layer, and as a third layer an Al coating layer formed on said second layer.

8. The multilayer metal-coated steel sheet according to claim 7, wherein said Zr coating layer and said Al-Zr alloy coating layer each have a layer thickness of not less than 0.05 μm, said Al coating layer has a layer thickness of not less than 0.5 μm, and the total layer thickness of all layers is in the range of 0.6 μm to 20 μm.

TABLE 2

| Sample No.: | Coating method | Zr layer (μm) | Al—Zr layer (μm) | alloy Zr (wt. %) | Al layer (μm) | Total layer thickness (%) | Zr, Al—Zr /total layer thickness ratio (%) | Adhesion | Corrosion resistance Before forming | Corrosion resistance After forming | Heat resistance |
|---|---|---|---|---|---|---|---|---|---|---|---|
| Example | | | | | | | | | | | |
| 1 | Method 3 | 0.05 | 0.05 | 35 | 5 | 5.1 | 2 | A | A | A | A |
| 2 | Method 3 | 2.5 | 0.5 | 45 | 2 | 5.0 | 60 | A | A | A | A |
| 3 | Method 3 | 1.0 | 0.5 | 15 | 4 | 5.5 | 27 | A | A | A | A |
| 4 | Method 4 | 1.0 | 0.5 | 15 | 4 | 5.5 | 27 | A | A | A | A |
| 5 | Method 3 | 0.02 | 0.05 | 10 | 5 | 5.07 | 1 | A | B | B | B |
| 6 | Method 3 | 0.08 | 0.02 | 5 | 5 | 5.1 | 2 | A | B | B | A |
| 7 | Method 3 | 4.0 | 0.5 | 20 | 2 | 6.5 | 69 | A | A | B | A |
| Comparative Example | | | | | | | | | | | |
| 1 | VD* | 0 | 0 | — | 6 | 6.0 | — | A | C | C | C |
| 2 | VD* | 3.0 | 0 | — | 0 | 3.0 | — | A | C | C | C |
| 3 | VD* | 0.05 | 0 | — | 6 | 6.05 | — | A | B | B | A |
| 4 | VD* | 4.0 | 0 | — | 2 | 6.0 | — | A | B | C | A |
| 5 | Hot dip Al coated steel sheet | | | | | 7.4 | — | A | C | C | C |

*Vacuum deposition coating

As described above, the multilayer metal-coated steel sheet of the present invention has the same adhesion as the conventional single-layer Al-coated steel sheets, and also has a superior corrosion resistance and heat resistance.

What is claimed is:

1. A multilayer metal-coated steel sheet comprising as a first layer a coating layer consisting essentially of Zr formed on the surface of a steel sheet, and as a second layer an Al coating layer formed on said first layer.

2. The multilayer metal-coated steel sheet according to claim 1, wherein said Zr coating layer has a layer thickness of not less than 0.05 μm, said Al coating layer has a layer thickness of not less than 0.5 μm, and the total layer thickness of said layer is in the range of 0.55 μm to 20 μm.

3. The multilayer metal-coated steel sheet according to claim 2, wherein said Zr coating layer has a layer thickness of not more than 60% of the total layer thickness.

4. A multilayer metal-coated steel sheet according to claim 2, wherein said total layer thickness is in the range of 3 μm to 10 μm.

9. The multilayer metal-coated steel sheet according to claim 8, wherein said Zr coating layer and said Al-Zr alloy coating layer have a total layer thickness of not more than 60% of the total thickness of all the layers.

10. A multilayer metal-coated steel sheet according to claim 8, wherein said total layer thickness is in the range of 3 μm to 10 μm.

11. The multilayer metal-coated steel sheet according to claim 7, wherein said Zr coating layer and said Al-Zr alloy coating layer have a total layer thickness of not more than 60% of the total thickness of all the layers.

12. A multilayer metal-coated steel sheet according to claim 11, wherein said Zr coating layer has a layer thickness of not more than 30% of the total layer thickness.

13. A multilayer metal-coated steel sheet according to claim 7, wherein neither Al or a AlZr alloy is in contact with said steel sheet.

14. A multilayer metal-coated steel sheet comprising as a first layer a Zr coating layer formed on the surface of a steel sheet, and as a second layer an Al coating layer formed on said first layer, wherein neither Al or a AlZr alloy is in contact with said steel sheet.

* * * * *